(12) United States Patent
Matsuura

(10) Patent No.: US 7,342,800 B2
(45) Date of Patent: Mar. 11, 2008

(54) HIGH FREQUENCY MODULE

(75) Inventor: Shuhji Matsuura, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/367,396

(22) Filed: Mar. 6, 2006

(65) Prior Publication Data

US 2006/0198116 A1  Sep. 7, 2006

(30) Foreign Application Priority Data

Mar. 7, 2005 (JP) ............................ 2005-062712

(51) Int. Cl.
*H05K 5/00* (2006.01)

(52) U.S. Cl. ............ 361/759; 361/752; 361/748; 361/679; 361/600

(58) Field of Classification Search ........... 361/600, 361/679, 724, 728, 729, 736, 747, 748, 752, 361/759, 760, 767, 768, 770
See application file for complete search history.

(56) References Cited

U.S. PATENT DOCUMENTS 5,740,019 A * 4/1998 Lee ........................ 361/759
6,223,430 B1 * 5/2001 Myszka et al. ............. 29/840
6,934,162 B2 * 8/2005 Perez et al. ............... 361/759
2004/0264113 A1 * 12/2004 Darr et al. ................. 361/601

FOREIGN PATENT DOCUMENTS

JP  7-38267 A  2/1995

* cited by examiner

*Primary Examiner*—Tuan T. Dinh
*Assistant Examiner*—Sheldon Soon
(74) *Attorney, Agent, or Firm*—Birch, Stewart, Kolasch & Birch, LLP

(57) ABSTRACT

A high frequency module that has a structure in which a frame-shaped shield case 3 is attached to a circuit substrate 2, wherein an extending segment 331 that extends in an inward direction of the case is formed on a case side plate 31 of the shield case 3, a protruding segment 332 is formed by providing a tip end portion of the extending segment 331 so as to stand perpendicularly, and an engaging portion 332a is formed by swelling out an approximate midpoint of the protruding segment 332 in an inward direction of the case by a drawing process. Furthermore, an inserting hole 21 is formed in the circuit substrate 2 at a location that corresponds to the protruding segment 332. Then, the shield case 3 is attached to the circuit substrate 2 by inserting the protruding segment 332 into the inserting hole 21 of the circuit substrate 2 so that the engaging portion 332a is passed over.

5 Claims, 4 Drawing Sheets

FIG.4
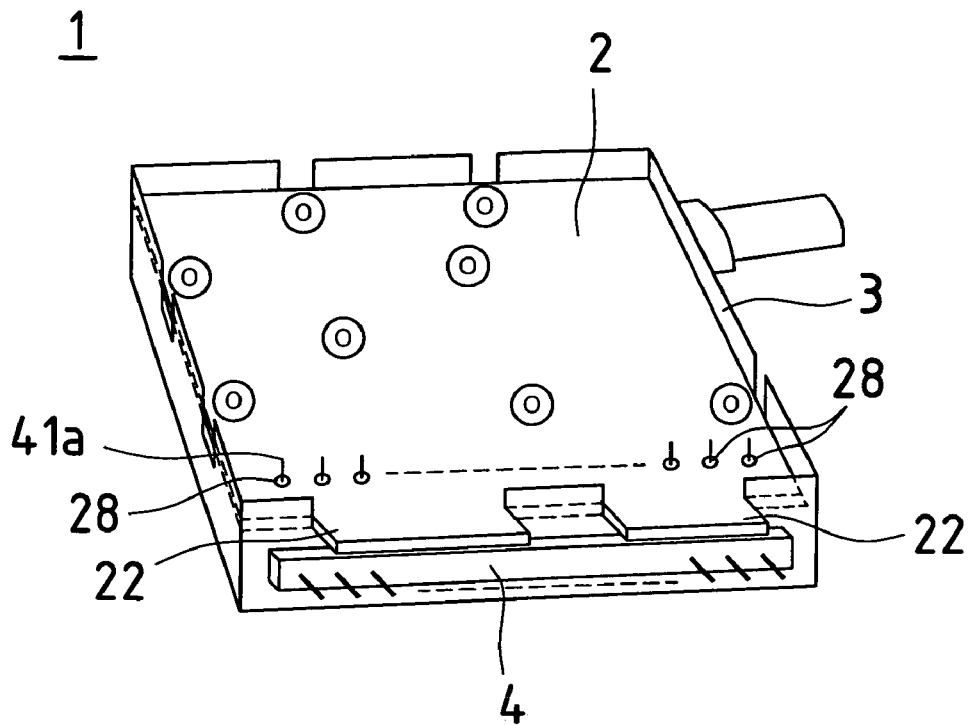
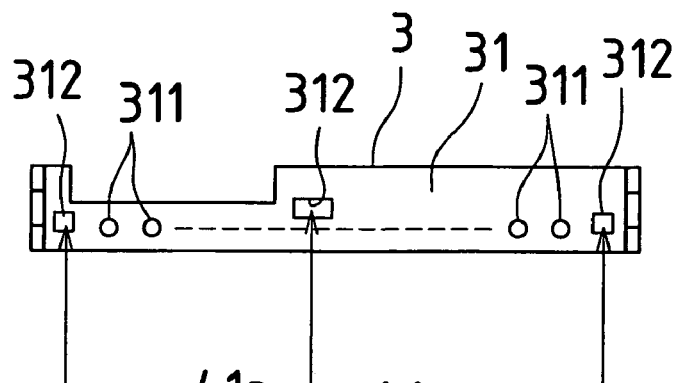
FIG.5A
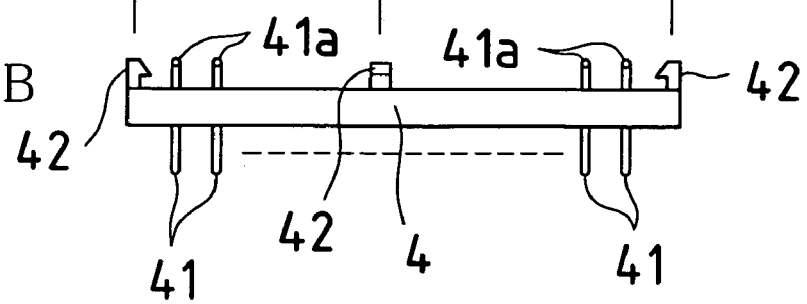
FIG.5B
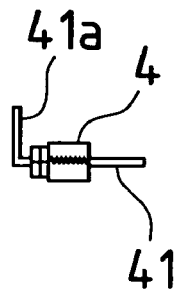
FIG.5C

HIGH FREQUENCY MODULE

BACKGROUND OF THE INVENTION

This application claims priority under 35 U.S.C. § 119 (a) on Patent Application No. 2005-62712 filed in Japan on Mar. 7, 2005, the entire contents of which are hereby implemented by reference.

a. Field of the Invention

The present invention relates to a high frequency module that is built into a high frequency device such as tuner, and the present invention more specifically relates to an improvement in an attachment structure of a circuit substrate and a shield case.

b. Description of the Related Art

In a high frequency module that is built into a high frequency device such as a tuner, an RF modulator, a switch box (SW-BOX), a voltage controlled oscillator (VCO) a temperature-compensated crystal oscillator (TCXO), a shield case is attached to a circuit substrate that has electronic components mounted thereon. Roles of this shield case include, for example, prevention of an influence of an outside electric field or magnetic field on a circuit that consists of electronic components and the like on a circuit substrate, as well as reinforcement of the mechanical strength of the circuit substrate, and prevention of an influence of a mechanical external force such as oscillation on a circuit that consists of electric components and the like on a circuit substrate. In addition, in a high frequency module in a radio device, a metal-made shield case is placed to cover the periphery of a circuit substrate in order to block electromagnetic waves from a high frequency circuit that is mounted on the circuit substrate.

As an example of a structure for attaching a shield case to such a circuit substrate, a structure as shown in FIGS. 6 and 7 has been used (for example, see JP H7-38267 (FIGS. 5 and 6)).

More specifically, a shield case 101 has a notch portion at an upper end portion 101*a* of a case side plate, and a leg portion 111 in the shape of a narrow horseshoe, with a tip end portion 111*a* wide and a base end portion 111*b* narrow, is formed within the notched portion. The shield case 101 is, then, set from the upper end portion (in FIG. 6A, set from below a circuit substrate 102 upwardly) so as to cover the periphery of the circuit substrate 102 and, as shown in FIG. 6B, the tip end portion 111*a* of the leg portion 111 is cocked (bent) inward using a processing jig or the like so that an end portion 102*a* of the circuit substrate 102 is held, and the tip end portion 111*a* of the leg portion 111 and a copper foil pattern (not shown) on the circuit substrate 102 are connected and fixed to each other with solder 103.

The reason why the circuit substrate 102 and the shield case 101 are connected and fixed in this manner is as follows. That is, after inserting an assembly part that has chip components mounted on the circuit substrate 102 into the shield case 101, the module needs to be flipped upside down to insert various insertion components, such as coils, a high frequency circuit (RFC), an intermediate frequency transformer (IFT) and a surface acoustic wave (SAW) filter, into the circuit substrate 102, and in order to prevent falling of the circuit substrate 102 at this time, the circuit substrate 102 and the shield case 101 need to be connected and fixed in advance.

Meanwhile, the circuit substrate 102 that has been connected and fixed to the shield case 101 as described above is, as shown in FIG. 7, provided with terminal board substrate portions 104 that extrude from the shield case 101 on one side thereof, and has a structure in which a terminal board 105 is attached to the bottom surface of the terminal board substrate portions 104. Reference numeral 106 in the drawing indicates an F connector.

As described above, in a conventional structure for attaching a shield case to a circuit substrate, a step for bending the leg portion 111 in the inward direction of the case is required when the shield case 101 is attached to the circuit substrate 102. For this reason, there is a problem in that the process man hour increases, which makes it difficult to simplify steps for producing a high frequency module. In addition, there is a problem in that a sufficient mounting strength of the solder 103 cannot be obtained due to a poor supply of the solder 103. Furthermore, when this high frequency module is installed, for example, on a TV, VTR, or DVD set device or the like, if the temperature of the environment for use greatly varies, for example from −20 degrees to +70 degrees (especially in winter, a large temperature difference is created between before and after turning on a device power), there is a problem in that a solder crack is caused by a stress between the leg portion 111 and the circuit substrate 102 since they have different thermal contraction rates.

In addition, in the markets for DVD, small-sized liquid crystal TV, and the like, on one hand, a short-type tuner is required, but on the other hand, circuit functions and electrical performance that are better than the conventional ones are usually required. For this reason, there has been a request for securing a larger mounting area for circuit components. However, with a conventional structure in which a terminal board for taking out terminals from a circuit substrate is attached to the bottom surface of the circuit substrate, there is a problem in that this portion of the circuit substrate cannot be used for mounting components, which practically decreases the mounting area of the circuit.

SUMMARY OF THE INVENTION

The present invention was made in view of the above-described problems, and it is an object of the invention to simplify the production operation at the time of attaching a shield case to a circuit substrate, and to increase the mounting area of the circuit of a circuit substrate.

For solving the above-described problems, a high frequency module according to the present invention has a structure in which a frame-shaped shield case is attached to a circuit substrate, wherein an extending segment that extends in an inward direction of the case is formed on a case side plate of the shield case, a protruding segment is formed by providing a tip end portion of the extending segment so as to stand perpendicularly, and an engaging portion is formed by swelling out an approximate midpoint of the protruding segment in an inward direction of the case. Meanwhile, an inserting hole is formed in the circuit substrate at a location that corresponds to the protruding segment. Furthermore, the shield case is attached to the circuit substrate by inserting the protruding segment into the inserting hole so that the engaging portion is passed over.

In the above-described high frequency module, the extending segment and the protruding segment are formed by bending a notched segment that has been notched from the case side plate.

With this configuration, since the engaging portion of the protruding segment passes over and is inserted and locked into the inserting hole of the circuit substrate only by inserting the protruding segment of the shield case into the inserting hole of the circuit substrate, dislocation of the once-inserted circuit substrate from the shield case can be reliably prevented. Therefore, even when the circuit substrate is flipped upside down without performing soldering at this point, problems such as falling of the circuit substrate from the shield case do not occur. In addition, since solder connection is made in a state in which the protruding segment is protruding from the inserting hole, the solder covers around the protruding portion of the protruding segment, and a sufficient soldering strength can be secured. In addition, since the strength against pressing in the inward direction of the shield case from the outside can be enhanced and vibration can be absorbed, making it possible to prevent solder cracks. Furthermore, since the extending segment and the protruding segment can be formed into any shapes by bending, it is possible to vary the lengths of the extending segment and the protruding segment depending on the electrode patterns formed on the circuit substrate, which makes it possible to facilitate designing of the circuit pattern.

Furthermore, high frequency module that has a structure in which a frame-shaped shield case is attached to a circuit substrate, wherein two slits that extend in a longitudinal direction are formed in a case side plate of the shield case, and an engaging portion is formed by swelling out an approximate midpoint of a columnar portion that has been formed between the two slits in an inward direction of the case. Then, the shield case is attached to the circuit substrate by having the engaging portion pass over an end portion of the circuit substrate by means of a spring structure of the columnar portion by setting the shield case to the circuit substrate.

With this configuration, since the engaging portion that has been formed at the approximate midpoint of the columnar portion passes over the end portion of the circuit substrate and locked only by inserting the shield case into the circuit substrate, dislocation of the one-locked circuit substrate from the shield case can be securely prevented. Therefore, even when the circuit substrate is flipped upside down without soldering it at this point, problems such as falling of the circuit substrate from the shield case do not occur. In addition, since no process application is required for the circuit substrate, this can be applied to various circuit substrates. Furthermore, only the slits are formed in the case side plate of the shield case, and a bending process is not performed for the columnar portion between the slits (in other words, a large opening is not created at this portion). Accordingly, the columnar portion has a sufficient shielding effect, and it is rare that the shield case as a whole experiences a decrease in shielding effect.

Furthermore, with the high frequency module according to the present invention, a terminal board for drawing out a terminal from the circuit substrate is formed separately from the circuit substrate, and a terminal of the terminal board and an electrode portion of the circuit substrate are connected in a state in which the terminal board is attached to the case side plate of a shield case. That is, a protruding portion that is to be attached to the case side plate of the shield case is formed on the terminal board, a locking hole for inserting and locking the protruding portion is formed in the case side plate of the shield case, and the terminal board is attached to the case side plate by inserting and locking the protruding portion into the locking hole.

As described above, by attaching the terminal board that has conventionally been attached directly to the circuit substrate on the case side plate of the shield case, the portion of the circuit substrate that has conventionally been used for attaching a terminal board can be newly utilized as a component mounting portion, which makes it possible to enlarge the component mounting area by the area of this portion. This is especially effective in small-sized, short-height type tuners.

BRIEF DESCRIPTION OF THE DRAWINGS

FIG. 4 is a diagram showing an overall configuration of a high frequency module according to the present invention.

FIG. 5A is a side view of a shield case, showing an attachment structure of a terminal board of a high frequency module according to Embodiment 4 of the present invention.

FIG. 5B is a plan view of a terminal board, showing an attachment structure of a terminal board of a high frequency module according to Embodiment 4 of the present invention.

FIG. 5C is a side view of a terminal board, showing an attachment structure of a terminal board of a high frequency module according to Embodiment 4 of the present invention.

DESCRIPTION OF THE INVENTION

Hereinafter, embodiments of the present invention will be described with reference to the accompanying drawings.

Embodiment 1

Figure 1A:
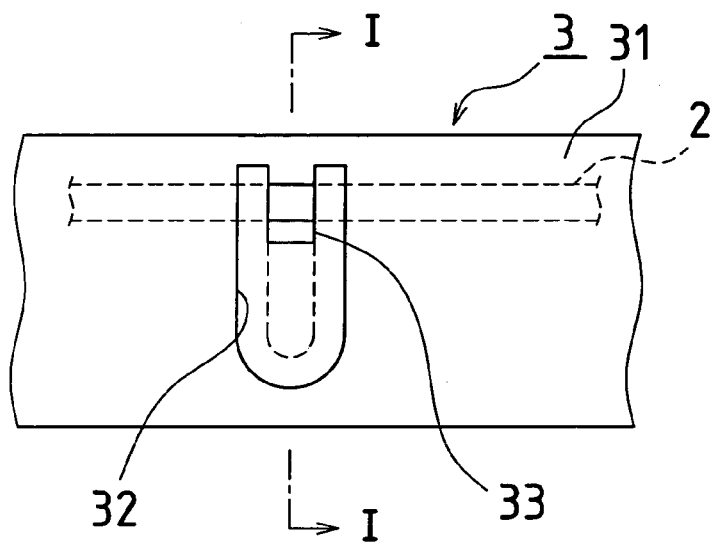
FIG. 1A is an enlarged side view showing a part of an attachment structure of a circuit substrate and a shield case of a high frequency module according to Embodiment 1 of the present invention.
Figure 1B:
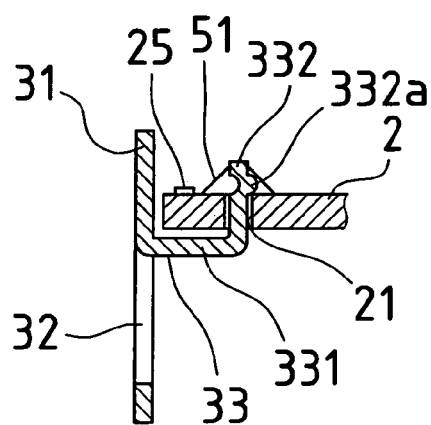
FIG. 1B is a cross-sectional view taken along the line I-I in FIG. 1A.

FIG. 1A is an enlarged side view showing a part of a structure for attaching a circuit substrate and a shield case of a high frequency module according to Embodiment 1 of the present invention. FIG. 1B is a cross-sectional view taken along the line I-I in FIG. 1A. In addition, FIG. 4 is a diagram showing an overall configuration of a high frequency module according to the present invention.

A high frequency module 1 according to the present invention is provided with a circuit substrate 2 and a frame-shaped shield case 3 attached to surround the periphery of the circuit substrate 2.

The shield case 3 is made by a bending process of a long metal plate material, and it is formed in the shape of a rectangle in a plane view with, for example, four side plates 31. Then, as shown in FIGS. 1A and 1B, a U-shaped notch portion 32 is formed in each of three of the side plates 31, with the exception of the one serving as the attachment surface for a terminal board 4, which will be described later, and a tongue segment 33 portion that is a remainder after notching of the notched portion 32 is formed so as to be bent in the shape of an L in the inward direction of the case, thus forming an extending segment 331 that extends from the side plate 31 in the inward direction of the case as well as a protruding segment 332 that is provided standing perpendicularly from the tip end portion of the extending segment 331. Furthermore, an engaging portion 332a that swells out in the inward direction of the case is formed at the approximate midpoint (or upper portion) of the protruding segment 332 by a drawing process. In Embodiment 1, the extending segment 331 and the protruding segment 332 are formed so that the extending segment 331 is longer than the protruding segment 332.

Meanwhile, as shown in FIG. 4, the circuit substrate 2 is formed in a rectangular shape in a plane view except for protruding portions 22, and has an IC or another device component of a surface mount type, not shown, that constitutes a receiving circuit is mounted on the circuit substrate 2. Such a circuit substrate 2 has an inserting hole 21 formed at a location that corresponds to the protruding segment 332 of the shield case 3.

Then, the shield case 3 is attached to the circuit substrate 2 by inserting the protruding segment 332 of the shield case 3 into the inserting hole 21 of the circuit substrate 2 so that the engaging portion 332a of the protruding segment 332 passes over the inserting hole 21 of the circuit substrate 2. By subsequently connecting and fixing the periphery of the protruding segment 332 with solder 51, a ground pattern 25 that has been provided near (or around) the inserting hole 21 is connected to the shield case 3 through the solder 51.

Since the attachment structure according to Embodiment 2 is a structure in which the tongue segment 36 is formed so as to be bent downward, the circuit substrate 2 into which the protruding segment 362 has been inserted and locked is positioned near the upper end surface of the shield case 3.

Embodiment 2

Figure 2A:
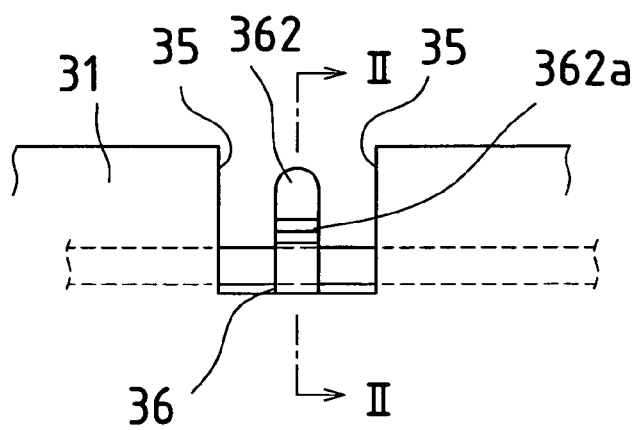
FIG. 2A is an enlarged side view showing a part of an attachment structure of a circuit substrate and a shield case of a high frequency module according to Embodiment 2 of the present invention.
Figure 2B:
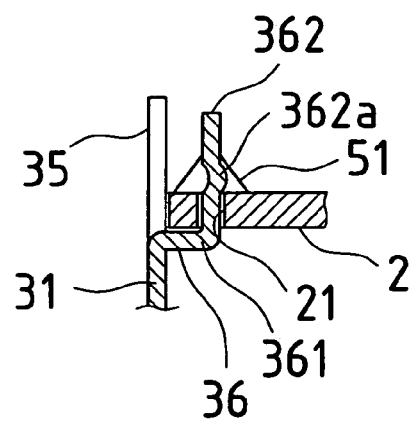
FIG. 2B is a cross-sectional view taken along the line II-II in FIG. 2A.

FIG. 2A is an enlarged side view showing a part of an attachment structure of a circuit substrate and a shield case of a high frequency module according to Embodiment 2 of the present invention. FIG. 2B is a cross-sectional view along the line II-II in FIG. 2A.

In Embodiment 2, a pair of notch portions 35 are formed on a side plate 31 of a shield case 3 downward from the upper edge of the case, and a tongue segment 36 portion between the notched portions 35 and 35 is formed so as to be bent in the shape of an L in the inward direction of the case, thus forming an extending segment 361 that extends from the side plate 31 in the inward direction of the case as well as a protruding segment 362 that is installed uprightly and perpendicularly from the tip end portion of the extending segment 361. Furthermore, an engaging portion 362a that swells out in the inward direction of the case is formed at the approximate midpoint (or upper portion) of the protruding segment 362 by a drawing process. In Embodiment 2, the extending segment 361 and the protruding segment 362 are formed so that the protruding segment 362 is longer than the extending segment 361.

Meanwhile, the circuit substrate 2 has an inserting hole 21 formed at a location that corresponds to the protruding segment 362 of the shield case 3.

Then, the shield case 3 is attached to the circuit substrate 2 by inserting the protruding segment 362 of the shield case 3 into the inserting hole 21 of the circuit substrate 2 so that the engaging portion 362a of the protruding segment 362 passes over the inserting hole 21 of the circuit substrate 2. By subsequently connecting and fixing the periphery of the protruding segment 362 with solder 51, a ground pattern that has been provided near (or around) the inserting hole 21 is connected to the shield case 3 through the solder 51.

Since thee attachment structure according to Embodiment 2 is a structure in which the tongue segment 33 is formed so as to be bent downward, the circuit substrate 2 into which the protruding segment 362 has been inserted and locked is positioned far from the upper end surface of the shield case 3.

With attachment structures according to Embodiments 1 and 2 as described above, the attachment structures according to Embodiments 1 and 2 can be selected based on the ground point. More specifically, the ground pattern of the circuit substrate 2 can be connected to a ground terminal (protruding segments 332 and 362) with the shortest distance by selecting the structure according to Embodiment 1 when the ground point is near the upper end surface of the shield case 3 and by selecting the structure according to Embodiment 2 when the ground pattern is placed inside relative to the inserting hole 21 of the circuit substrate 2. The grounding design is very important for a high frequency circuit, and it is common that a dead ground is usually provided at the shield case, so that the present invention is very effective in this respect.

Embodiment 3

Figure 3A:
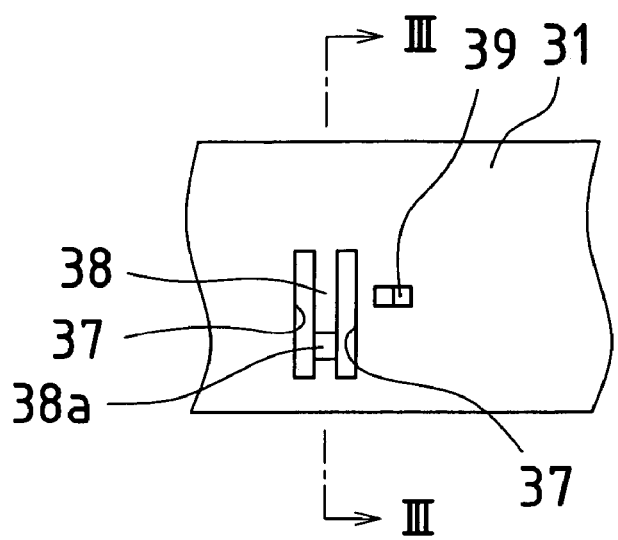
FIG. 3A is an enlarged side view showing a part of an attachment structure of a circuit substrate and a shield case of a high frequency module according to Embodiment 3 of the present invention.
Figure 3B:
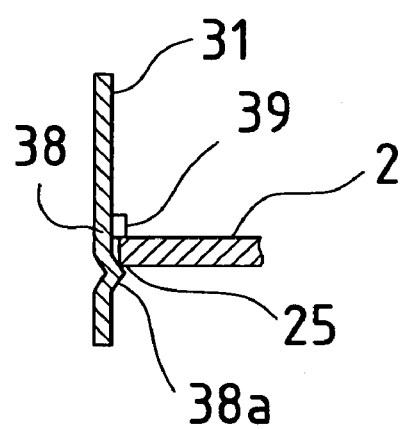
FIG. 3B is a cross-sectional view along the line III-III in FIG. 3A.
Figure 6A:
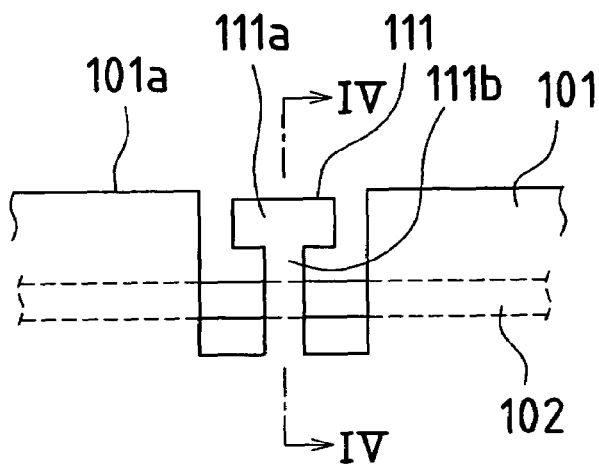
FIG. 6A is an enlarged side view showing a part of an example of an attachment structure of a shield case to a circuit substrate of a conventional high frequency module.
Figure 6B:
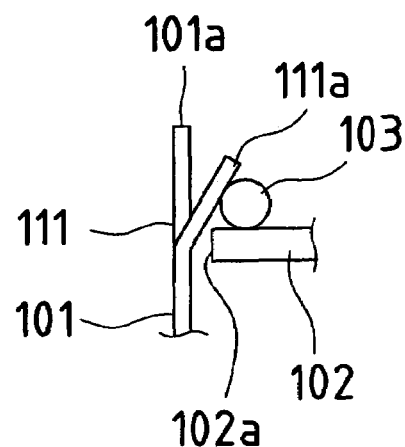
FIG. 6B is a cross-sectional view taken along the line IV-IV in FIG. 6A.
Figure 7:
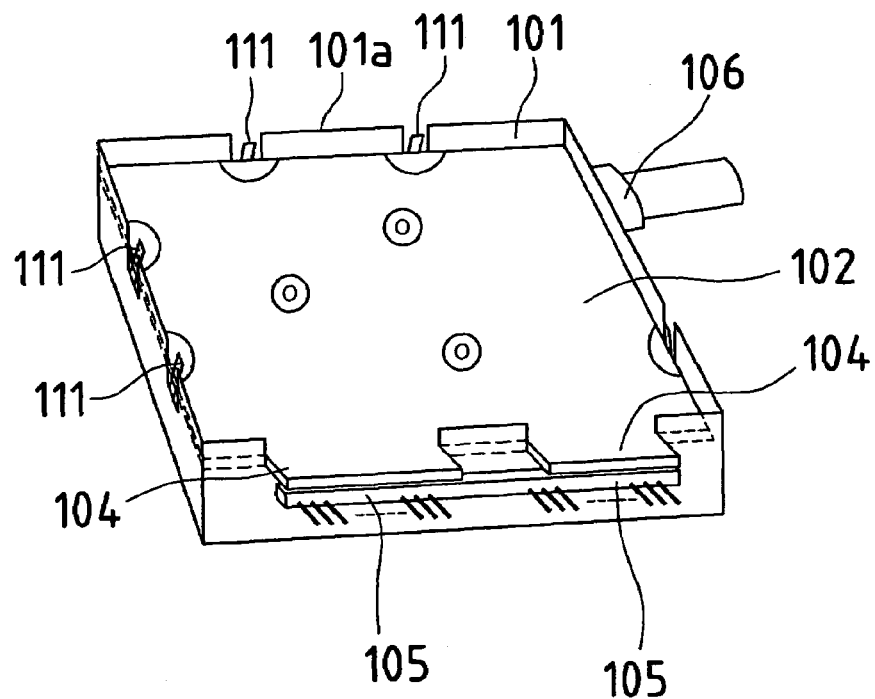
FIG. 7 is a diagram showing an overall configuration of a conventional high frequency module.

FIG. 3A is an enlarged side view showing a part of an attachment structure of a circuit substrate and a shield case of a high frequency module according to Embodiment 3 of the present invention. FIG. 3B is a cross-sectional view taken along the line III-III in FIG. 3A.

In Embodiment 3, two slits 37 that extend in the longitudinal direction are formed on a case side plate 31 at the approximate midpoint of the height direction thereof, and the approximate midpoint (in the drawing, location slightly lower than the midpoint) of a columnar portion 38 formed between the two slits 37 is swelled out in the inward direction of the case by a drawing process, thus forming an engaging portion 38a. Furthermore, a substrate receiving portion 39 that protrudes in the inward direction of the case is formed in the case side plate 31 at a location that is near the columnar portion 38 and that is higher by the thickness of the circuit substrate 2 from the engaging portion 38a. This substrate receiving portion 39 may be formed by notching the case side plate 31 and bending it in the inward direction of the case, or, as with the columnar portion 38, may be formed by forming two slits that extend in the lateral direction and swelling out a columnar portion between the slits in the inward direction of the case (for example, protruding in the shape of a V or a U by a drawing process (or by making it protrude).

Meanwhile, no processes have been performed on the circuit substrate 2 for attaching to a shield case 3.

Then, an end portion 25 of the circuit substrate 2 is held between the engaging portion 38a and the substrate receiving portion 39 by having the engaging portion 38a pass over the end portion 25 of the circuit substrate 2 by setting the shield case 3 to the circuit substrate 2 from above. Thus, the shield case 3 is attached to the circuit substrate 2.

With the structure according to Embodiment 3, only the slits 37 are formed in the case side plate 31 of the shield case 3, and a bending process is not performed on the columnar portion 38 between the slits 37, so that the columnar portion 38 has a sufficient shielding effect, and it is rare that the shield case 3 as a whole experiences a decrease in shielding effect.

Embodiment 4

FIGS. 4, 5A, 5B, and 5C show an attachment structure of a terminal board of a high frequency module according to Embodiment 4 of the present invention. FIG. 4 is a diagram showing an overall configuration of a high frequency module. FIG. 5A is a side view of a shield case, FIG. 5B is a plan view of a terminal board, and FIG. 5C is a side view of a terminal board.

In Embodiment 4, a structure in which a terminal board 4 through which a terminal is drawn out of a circuit substrate 2 is not directly attached to the circuit substrate 2, but is attached to a case side plate 31 of a shield case 3 so that each of the terminals 41 of the terminal board 4 is connected to an electrode portion (electrode pattern formed on the surface, not shown) of the circuit substrate 2.

For this reason, through-holes 311 for respectively inserting the terminals 41 provided on the terminal board 4 are formed in the case side plate 31, and locking holes 312 for fixing the terminal board 4 to the case side plate 31 in a state in which the terminals 41 are inserted through the through-holes 311 are formed at a plurality of locations of the case side plate 31. In Embodiment 4, the locking holes 312 are formed at a total of three locations, more specifically one each at the right, left, and in the middle.

Meanwhile, protruding claws 42 for attaching to the case side plate 31 are formed respectively at three locations of the terminal board 4 that correspond to the positions of the locking holes 312. Furthermore, each of the terminals 41 are formed in the shape of an L in a lateral direction, with its portion that protrudes from the back surface side of the terminal board 4 (in other words, the side of the surface that is spliced to the case side plate 31) rising vertically. Then, these vertically rising portions (vertical terminal segment) 41a are inserted through terminal insertion holes 28 that have been formed at the corresponding locations on the circuit substrate 2. In addition, electrode patterns that correspond to the respective terminals are formed on the periphery of the terminal insertion holes 28.

In order to attach the terminal board 4 that has a configuration as described above to the case side plate 31 of the shield case 3, first, the terminals 41 are inserted through the respectively corresponding through-holes 311, and the terminal board 4 is pressed toward the case side plate 31 in a state in which the back surface of the terminal board 4 is facing the case side plate 31. This causes the protruding claws 42 of the terminal board 4 to be inserted into the locking holes 312 that they face. In this insertion process, the protruding claws 42 elastically deform so that they are spread out (provided, the protruding claw 42 in the center is raised in the upward direction) while slidingly contacting the circumference of the locking holes 312, and after passing over the locking holes 312, the compensation force causes engagement of the respective protruding claws 42 on the circumference of the locking holes 312. This attaches and fixes the terminal board 4 to the case side plate 31 of the shield case 3. At this point, since the vertical terminal segment 41a of the respective terminals 41 are protruding upward from the corresponding terminal insertion holes 28 of the circuit substrate 2, the respective terminals 41 are electrically connected to the circuit substrate 2 by connecting and fixing the periphery of the vertical terminal segment 41a in this state with solder that is not shown.

As describe above, in Embodiment 4, the protruding portions 22 of the circuit substrate 2 to which the terminal board 4 has conventionally been attached can be newly utilized as component mounting portions by attaching the terminal board 4 that has conventionally been directly attached to the circuit substrate 2 to the case side plate 31 of the shield case 3. In other words, the component mounting area can be enlarged. This is especially effective in small-sized, short-height type tuners.

The high frequency module according to the present invention is suitably used not only in reception of conventional analog TV broadcasting waves, but also in reception of packet data of digital terrestrial broadcasting as well as of cable internet that utilizes cable TV (CATV) lines.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

What is claimed is:

1. A high frequency module that has a structure in which a frame-shaped shield case is attached to a circuit substrate,
    wherein an extending segment that extends in an inward direction of the case is formed on a case side plate of the shield case, a protruding segment is formed by providing a tip end portion of the extending segment so as to stand in a direction substantially perpendicular to a remaining portion of the extending segment, and an engaging portion is formed by swelling out an approximate midpoint of the protruding segment in an inward direction of the case,
    wherein an inserting hole is formed in the circuit substrate at a location that corresponds to the protruding segment, and
    wherein the shield case is attached to the circuit substrate by inserting the protruding segment into the inserting hole so that the engaging portion is passed over.

2. The high frequency module according to claim 1,
    wherein the extending segment and the protruding segment are formed by bending a notched segment that has been notched from the case side plate.

3. The high frequency module according to claim 2,
    wherein a terminal board for drawing out a terminal from the circuit substrate is formed separately from the circuit substrate, and a terminal of the terminal board and an electrode portion of the circuit substrate are connected in a state in which the terminal board is attached to the case side plate of a shield case.

4. The high frequency module according to claim 1,
    wherein a terminal board for drawing out a terminal from the circuit substrate is formed separately from the circuit substrate, and a terminal of the terminal board and an electrode portion of the circuit substrate are connected in a state in which the terminal board is attached to the case side plate of a shield case.

5. The high frequency module according to claim 4,
    wherein a protruding portion that is to be attached to the case side plate of the shield case is formed on the terminal board, a locking hole for inserting and locking the protruding portion is formed in the case side plate of the shield case, and the terminal board is attached to the case side plate by inserting and locking the protruding portion into the locking hole.

* * * * *